(12) United States Patent
Ono et al.

(10) Patent No.: US 6,933,607 B2
(45) Date of Patent: Aug. 23, 2005

(54) SEMICONDUCTOR DEVICE WITH BUMPS ON ELECTRODE PADS ORIENTED IN GIVEN DIRECTION

(75) Inventors: Atsushi Ono, Yamatokoriyama (JP); Yasunori Chikawa, Kitakatsuragi-gun (JP); Makoto Kanda, Kashihara (JP); Norimitsu Nie, Kashiba (JP); Satoru Tone, Nara (JP); Motoji Shiota, Kashihara (JP); Akio Inohara, Shijinawate (JP); Hirokazu Yoshida, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/282,054

(22) Filed: Oct. 29, 2002

(65) Prior Publication Data

US 2003/0062623 A1 Apr. 3, 2003

Related U.S. Application Data

(62) Division of application No. 08/989,328, filed on Dec. 11, 1997, now Pat. No. 6,525,422.

(30) Foreign Application Priority Data

Jan. 20, 1997 (JP) .................................................. 9-8047

(51) Int. Cl.[7] .......................... H01L 23/48; H01L 23/52; H01L 29/40
(52) U.S. Cl. ....................................... 257/737; 257/738
(58) Field of Search ................................ 257/737, 738, 257/786

(56) References Cited

U.S. PATENT DOCUMENTS

| 4,680,610 | A | | 7/1987 | Pammer | 257/727 |
|---|---|---|---|---|---|
| 5,016,082 | A | * | 5/1991 | Roth | 257/735 |
| 5,422,516 | A | | 6/1995 | Hosokawa | 257/775 |
| 5,442,241 | A | | 8/1995 | Tane | 257/781 |
| 5,569,960 | A | | 10/1996 | Kumazawa et al. | 257/738 |
| 5,587,341 | A | | 12/1996 | Masayuki et al. | 437/206 |
| 5,731,636 | A | | 3/1998 | Chun | 257/737 |
| 5,744,859 | A | | 4/1998 | Ouchida | 257/668 |
| 6,525,422 | B1 | | 2/2003 | Ono et al. | 257/737 |

FOREIGN PATENT DOCUMENTS

| JP | 58-83159 | 6/1983 |
|---|---|---|
| JP | 60-224247 | 11/1985 |

(Continued)

OTHER PUBLICATIONS

Japanese Office Action mailed Feb. 10, 2004 (w/English translation).

U.S. Appl. No. 08/989,328 filed Dec. 11, 1997.

U.S. Appl. No. 10/283,212 filed Oct. 30, 2002.

*Primary Examiner*—Phat X. Cao
(74) *Attorney, Agent, or Firm*—Nixon & Vanderhye P.C.

(57) ABSTRACT

A semiconductor device includes a semiconductor substrate, a plurality of electrode pads aligned on the semiconductor substrate, and a plurality of bump electrodes placed on each electrode pad, wherein the plurality of bump electrodes on the electrode pad are aligned in a direction orthogonal to a direction where the electrode pads are aligned. A manufacturing method of the semiconductor device includes the steps of patterning a photoresist which serves as a bump electrode forming use mask on the semiconductor substrate having formed thereon the electrode pads and forming a bump electrode in a perpendicular straight wall shape to be thinner than the photoresist by plating the bump electrode forming use metal to the electrode pad.

28 Claims, 13 Drawing Sheets

FOREIGN PATENT DOCUMENTS

| | | |
|---|---|---|
| JP | 01-120040 | 5/1989 |
| JP | 01-205543 | 8/1989 |
| JP | 02-110948 | 4/1990 |
| JP | 56136/1991 | 5/1991 |
| JP | 03-141654 | 6/1991 |
| JP | 03-155636 | 7/1991 |
| JP | 04-120734 | 4/1992 |
| JP | 13418/1993 | 1/1993 |
| JP | 05-129306 | 5/1993 |
| JP | 06-314723 | 11/1994 |
| JP | 06-333931 | 12/1994 |
| JP | 07-058112 | 3/1995 |
| JP | 58112/1995 | 3/1995 |

\* cited by examiner

FIG. 8
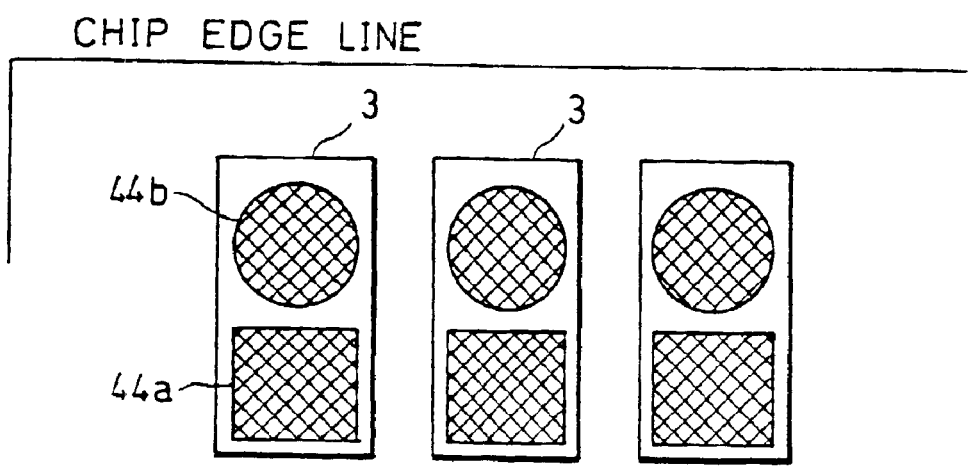
FIG.9(a)  FIG.9(b)  FIG.9(c)
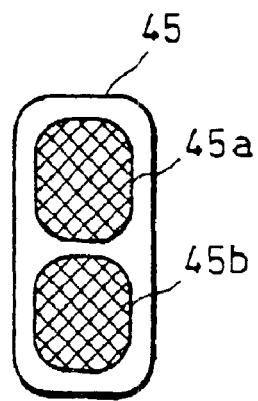 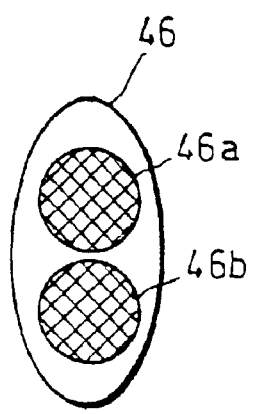 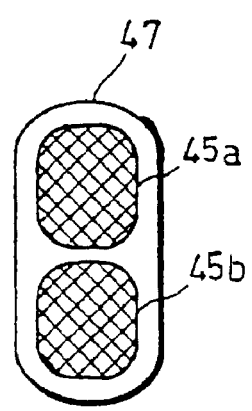

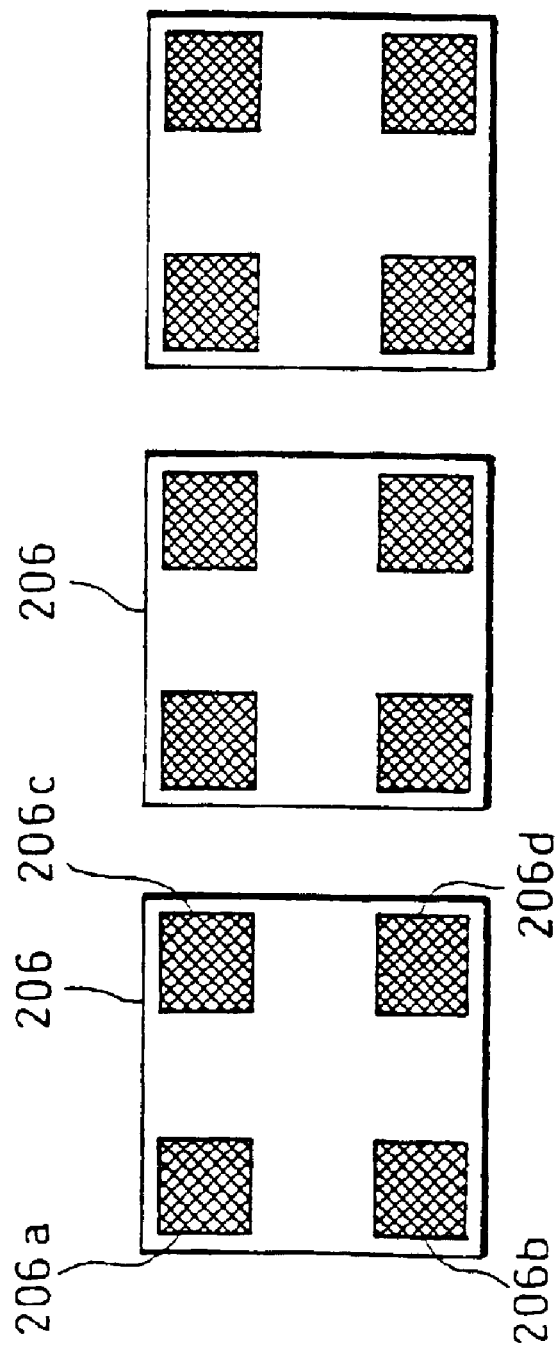

SEMICONDUCTOR DEVICE WITH BUMPS ON ELECTRODE PADS ORIENTED IN GIVEN DIRECTION

This application is a division of application Ser. No. 08/989,328, filed Dec. 11, 1997 now U.S Pat. No. 6,525,422, the entire content of which is hereby incorporated by reference in this application.

FIELD OF THE INVENTION

The present invention relates to a semiconductor device including bump electrodes, a manufacturing method and a testing method of the same, and also relates to a liquid crystal display device, a circuit substrate and a tape carrier package (hereinafter referred to as TCP) respectively including the semiconductor device.

BACKGROUND OF THE INVENTION

Known methods of electrically connecting a semiconductor device to a liquid crystal display device, a circuit substrate or a TCP include a wireless bonding method wherein a bump electrode is provided on an electrode terminal of a semiconductor device, and the semiconductor device is bonded directly to the liquid crystal display device, the circuit substrate or the TCP using the bump electrode.

A concrete example will be given through the case of the liquid crystal display device of a chip-on-glass (hereinafter referred to as COG) method wherein a liquid crystal driver chip as a semiconductor device is directly face-down-bonded to a liquid crystal panel. The described COG method is classified into two types: (i) a paste COG method wherein the liquid crystal driver chip and the liquid crystal panel are connected by means of an electrically conductive paste; and (ii) an ACF-COG method wherein the liquid crystal driver chip and the liquid crystal panel are connected by means of an anisotropic electrically conductive film (hereinafter referred to as ACF).

As shown in FIG. 13(a), a liquid crystal driver chip A' includes a semiconductor base 101 whereon an insulating film 102, an electrode pad 103, and a protective film 104 with an opening are laminated in this order. On the opening, a bump electrode 106 is formed via a barrier metal 105. On the other hand, a liquid crystal panel B' on which the described liquid crystal drive chip A' is to be bonded includes a glass substrate 109 whereon a conductive pattern 110 and a protective film 111 are laminated in this order.

In the paste COG method, after a conductive paste 112 is applied to the bump electrode 106 of the liquid crystal driver chip A', the liquid crystal driver chip A' is face-down-bonded to the liquid crystal panel B'. Then, the conductive paste 112 is cured, thereby connecting the bump electrode 106 and input and output terminals of the conductive pattern 110n.

On the other hand, in the ACF-COG method, as shown in FIG. 13(b), an ACF composed of a binder resin 107 and conductive particles 108 is enclosed in a spacing formed between the liquid crystal driver chip A' and the liquid crystal panel B', thereby connecting the bump electrode 106 and the input and output terminals of the conductive pattern 110 via the conductive particles 108.

However, the described COG method wherein the liquid crystal driver chip is directly face-down-bonded to the liquid crystal panel has a drawback in that a mounting inferior occurs when mounting the panel due to a bump inferior such as a bump defect, irregularity in bump height, etc.

Moreover, in the COG method, as the bump electrode is bonded to a hard material such as glass, etc., irregularity in height of bumps within the liquid crystal driver chip would cause a problem. For example, in the case of the ACF-COG method, the conductive particles in the ACF has an average particle diameter in a range of from 3 to 5 μm, and thus if a gap between heights of the adjoining bump electrodes is larger than the diameter of the conductive particle, a connection inferior occurs. Also, in the case of the paste COG method, if a gap between heights of the adjoining bump electrodes is larger than the thickness of the paste to be applied, a connection inferior occurs.

When adopting the COG method, in order to prevent an increase in a contact resistance, or a contact inferior due to an unexpected bump defect, a multiple port structure is generally adopted for the power source terminal and the input terminal. For the output terminal, however, in consideration of a space required, etc., the multiple port structure is not adopted.

Therefore, even when only one of the bump electrodes on the output terminal is defective, or significantly lower than the adjoining bump electrode (by not less than a conductive particle diameter), a panel display defect such as a line defect, etc., occurs, or fixing of the defective bump electrode is required or wasted otherwise.

The described problem occurs not only in the liquid crystal display device of the COG method but also in the circuit substrate wherein the semiconductor chip is face-down-bonded to the substrate main body such as a print substrate, a ceramic substrate, etc. Such problem occurs because the substrate main body to which the bump electrode is bonded is made of a hard material.

The TCP has advantageous features over other face-down-bonding method in that (i) the inner lead is flexible, and (ii) an eutectic crystal is generated by the bump electrode and Sn plated onto the inner lead, and the inner lead is inserted into the bump electrode. However, even for the described TCP, for example, if a bump defect occurs, or a significant gap in bump height is generated, a connection inferior cannot be avoided.

In order to counteract the described problem, as shown in FIG. 14, Japanese Unexamined Utility Model Publication No. 56136/1991 (Jitsukaihei 3-56136) discloses a bonding bump wherein four divided gold bumps (bump electrodes) 206a, 206b, 206c and 206d are formed on a square connection terminal (electrode pad) 206. According to the described arrangement, a semiconductor chip is bonded to a substrate terminal by means of a curing resin around the metal bump. Therefore, by dividing the metal bump into four, an occurrence of a connection inferior due to a residual resin remaining between (a) the metal bumps 206a, 206b, 206c and 206d, and (b) the substrate terminal can be suppressed.

However, the described arrangement of Japanese Unexamined Utility Model Publication No. 56136/1991 has a drawback in that as the bump electrode is divided bidirectionally along a column and a row, narrowing of an electrode pad pitch, i.e., a wiring pitch is not possible.

Moreover, the arrangement wherein the bump electrode composed of a transferred bump substrate is directly bonded to the semiconductor chip like the case of the above Gazette cannot be applied when the electrode pad pitch is not more than 100 μm. Recently, as an electrode pad pitch of from 50 to 80 μm has been generally adopted to meet a demand for a miniaturization of a semiconductor chip, the described method cannot be used in practical applications.

The described mechanism is the same as the following mechanism. The generally used transfer bump adopts an inner lead bonding method wherein the bump electrode is transferred to a leading end of the inner lead of the tape carrier, and the bump electrode thus transferred is inner-lead-bonded to the electrode pad of the semiconductor chip. Although this method has an advantageous feature in that a wafer bump process can be omitted, as a mechanical connection is repeated twice, it is not practical to use the method for the electrode pad pitch of not more than 100 μm in view of precision. Therefore, in consideration of the facts that the mechanical connection is required, and the described transferring of the bump electrode can be performed only chip by chip, a wafer bump method wherein the bump electrode is formed on the electrode pad of the semiconductor chip in the wafer bump process is superior to the transfer bump method in view of both precision and mass production.

As to the divided bump electrodes, Japanese Unexamined Patent Publication No. 13418/1993 (Tokukaihei 5-13418) and Japanese Unexamined Patent Publication No. 58112/1995 (Tokukaihei 7-58112) disclose four divided bump electrodes for the purpose of suppressing a generation of a thermal stress.

However, neither of described Gazettes teach two divided bump electrodes or the mounting structure which offers a lower rate of an inferior such as a bump defect, etc. These Gazettes also fail to refer to the wiring pitch. Especially, Japanese Unexamined Patent Publication No. 13418/1993 (Tokukaihei 5-13418) discloses the arrangement wherein a solder layer is formed on the bump electrode. According to the described arrangement, even when only one of the bump electrodes is defective, the solder layer cannot be formed in a shape as desired, and an occurrence of a bump inferior cannot be suppressed. On the other hand, Japanese Unexamined Patent Publication No. 58112/1995 (Tokukaihei 7-58112) discloses the diode element only, and does not refer to the concept of the wiring pitch.

SUMMARY OF THE INVENTION

It is an object of the present invention to provide a semiconductor device which suppresses an occurrence of a defect such as a bump defect, etc., and enables a narrowing of an electrode pad pitch.

In order to achieve the above object, the semiconductor device of the preset invention includes a semiconductor substrate; a plurality of electrode pads aligned in parallel on the semiconductor substrate; and a plurality of bump electrodes placed on each of the plurality of electrode pads, the plurality of bump electrodes placed on the electrode pad are aligned in a direction orthogonal to the direction where the electrode pads are aligned.

According to the described arrangement, as a plurality of divided bump electrodes are provided for each electrode pad, compared with the case of adopting a single bump electrode, an occurrence of a defective bump electrode can be suppressed. Namely, in the case of a single bump electrode, if a bump defect occurs, or a significant gap is generated between heights of the adjoining bump electrodes, etc., a connection inferior occurs when mounting the semiconductor device. However, in the case of adopting a plurality of divided bump electrodes, even if a bump defect or a gap between heights of the adjoining bump electrodes occurs in some of the plurality of divided bump electrodes, as long as at least one bump electrode is connected, an occurrence of the connection inferior can be avoided. As the described arrangement permits a significantly lower proportion of a connection inferior when mounting the semiconductor device, an improved yield in manufacturing the bump electrodes and an improved reliability of a connected state can be achieved.

Furthermore, as the plurality of bump electrodes are aligned in a direction orthogonal to the direction where the electrode pads are aligned, an interval between the electrode pads can be reduced to the minimum. As this permits a narrower electrode pad pitch, the size of a semiconductor device can be reduced.

It is another object of the present invention to provide a manufacturing method of a semiconductor device of the present invention which permits bump electrodes to be prepared at a significantly improved yield.

In order to achieve the above object, the manufacturing method of the semiconductor device of the present invention is characterized by including the steps of: patterning a photoresist which serves as a bump electrode forming use mask on the semiconductor substrate having formed thereon the electrode pads, to be thicker than the bump electrodes; and plating the bump electrode forming use metal on an electrode pad to form a bump electrode in a perpendicular straight wall shape, to be thinner than the photoresist.

According the described method, mutual effects among the plurality of bump electrodes when plating can be eliminated, thereby achieving a significantly improved yield of the bump electrodes.

It is still another object of the present invention to provide a testing method of a semiconductor device of the present invention which permits an occurrence of an abnormality in shape of a bump electrode to be suppressed to the minimum.

In order to achieve the above object, the testing method of the semiconductor device of the present invention is characterized by including the step of performing an electrical characteristic test by making a test prober in contact with a bump electrode formed on the inner most side of the semiconductor substrate of the plurality of bump electrodes.

When carrying out the electrical characteristic test, in order to ensure a contact between the bump electrodes and the test prober, a pressure is applied after the test prober is made in contact with the bump electrode. Therefore, the test prober tends to move inside of the chip. Here, in the arrangement where the test prober is made in contact with the outer bump electrode, if a missing of the bump electrode occurs, the prober would push the base portion of the inner bump, which may cause a missing of the inner bump as well. Furthermore, when the test prober is made in contact with the outer bump electrode, in an event of a deformation of the bump electrode due to some trouble, the deformation of the outer bump electrode may cause the inner electrode to be deformed.

In order to counteract the described problems, the method of testing the semiconductor device in accordance with the present invention is arranged such that the test prober is made in contact with the bump electrode formed on the inner most side. As a result, even in an event of an abnormality in an applied pressure to a probe needle, the defective bump in its shape due to a mechanical strength applied when testing using the test prober can be suppressed to the minimum.

The novel features which are considered as characteristic of the invention are set forth in particular in the appended claims. The improved treatment method, as well as the construction and mode of operation of the improved treatment apparatus, will, however, be best understood upon perusal of the following detailed description of certain specific embodiments when read in conjunction with the accompanying drawings.

BRIEF DESCRIPTION OF THE DRAWINGS

FIG. 8 is a plan view showing the case where the respective connection surfaces of the bump electrodes have different shapes;

FIG. 9(a), FIG. 9(b) and FIG. 9(c) are plan views respectively showing different shapes of an electrode pad and the bump electrodes;

FIG. 14 is a plan view showing a structure and an arrangement of bump electrodes in conventional semiconductor chips.

DESCRIPTION OF THE EMBODIMENTS

The following descriptions will explain one embodiment of the present invention in reference to FIG. 1 through FIG. 12. In the present embodiment, explanations will be given through the case of a liquid crystal display device wherein a semiconductor chip as a semiconductor device is mounted by the ACF-COG method.

Figure 2A:
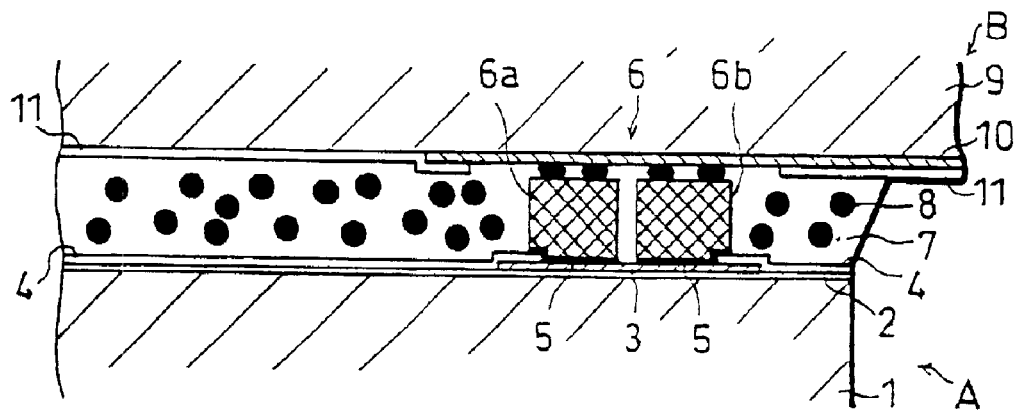
FIG. 2(a) is a cross-sectional view showing a part of a liquid crystal display device where the semiconductor chip is mounted.

FIG. 2(a) is a cross-sectional view showing a part of the liquid crystal display device where the semiconductor chip is mounted. As shown in FIG. 2(a), a semiconductor chip A includes a semiconductor substrate 1 whereon an insulating film 2, an electrode pad 3, and an opening section 4a (see FIG. 3(b)) are formed in this order. Further, a bump electrode 6 is formed on the opening section 4a via a barrier metal 5. The opening section 4a has a slightly smaller diameter than the circumference of the bump electrode 6. The bump electrode 6 is composed of two bump electrodes 6a and 6b which are provided on the inner side and the edge side of the semiconductor chip A respectively.

On the other hand, a liquid crystal panel B includes a glass substrate 9 whereon a conductive pattern 10, and a protective film 11 are formed in this order. The electrode pad 3 of the semiconductor chip A is face-down bonded onto input and output terminals of the conductive pattern 10 via the bump electrodes 6a and 6b to be connected thereto.

Namely, the liquid crystal display device is arranged such that an ACF composed of the binder resin 7 and the conductive particles 8 is enclosed in a spacing formed between the semiconductor chip A and the liquid crystal panel B. As a result, the bump electrode 6 is connected to the input and output terminals of the conductive pattern via the conductive particles 8.

Figure 1:
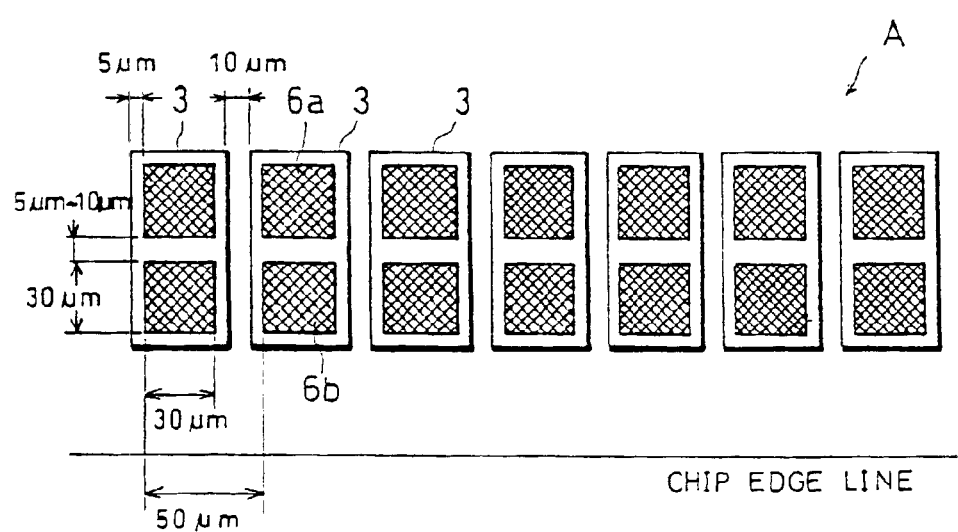
FIG. 1 is a plan view showing a structure and an arrangement of a bump electrode in a semiconductor chip in accordance with one embodiment of the present invention.

As shown in the plan view of FIG. 1, a plurality of the electrode pads 3 are provided in parallel along the edge line of the semiconductor chip A, and each electrode pad 3 is arranged such that the width "a" of the electrode pad 3 in the direction of aligning the electrode pads 3 is shorter than the width "b" in a direction orthogonal to the direction where the electrode pads 3 are aligned, i.e., the width "a": the width "b" is approximately 1:2.

The respective connection surfaces of the bump electrodes 6a and 6b, to be connected to the conductive pattern 10 of the liquid crystal panel B are substantially the same (square in this example). The connection surfaces of the bump electrodes 6a and 6b respectively have sufficient areas for the test prober to contact thereon.

An example of the semiconductor chip A will be explained.

As shown in FIG. 1, a sample having two divided bump electrodes 6a and 6b on the electrode pad 3 is formed. Here, the electrode pad 3 has a width "a" in an alignment direction of the electrode pads 3 of 40 $\mu$m, and a width "b" in a direction orthogonal to the direction where the electrode pads are aligned in a range of from 75 to 80 $\mu$m. The bump electrodes 6a and 6b respectively have square connection surfaces of 30 $\mu$m×30 $\mu$m which are placed at an interval of from 5 to 10 $\mu$m.

In this example, the bump electrode 3 is formed by a generally adopted wafer method, and divided bump electrodes 6a and 6b can be manufactured without problem.

The respective bump electrodes 6a and 6b are formed so as to have respective connection surfaces of around 30 $\mu$m×30 $\mu$m size which is the minimum size which permits a desirable contact of a probe needle for use in testing electrical characteristics in a stage of wafer. This area of 900 $\mu m^2$ (not necessarily square in shape) is sufficient for mounting the conductive particles 8 (see FIG. 2) in a range of from 3 to 5 $\mu$m onto the bump electrodes 6a and 6b, and even if one of the bump electrodes 6 is missing, the contact state can be maintained.

Therefore, by forming the respective connection surfaces of the bump electrodes 6a and 6b in around 30 μm×30 μm size, a desirable connection can be ensured, and as a result, it is confirmed that the semiconductor chip can be mounted with an improved reliability. Furthermore, the described arrangement of the connection surfaces enables a narrowing of an electrode pad pitch up to 50 μm.

As a comparative example, a bump electrode having the same arrangement as the described example except for the shape of the bump electrode is prepared. The comparative bump electrode has a connection surface in rectangular shape in around 30 μm×70 μm size, and is not divided.

As to the electrical characteristic test after forming the bump electrode, there is no significant difference from the comparative sample in yield, etc. Furthermore, as a result of visual inspection, an abnormality in shape of the two divided bump electrodes is not observed at the same time.

As a result of mounting the sample and the comparative sample for 1470 chips each on the liquid crystal panel by the ACF-COG method, a defective due to an abnormality in the bump shape is generated in the comparative sample at 1.02%. In contrast, no defective bump electrode is generated from the sample of the present embodiment. As a result, it has been confirmed that the mounting inferior due to an abnormality in shape of the bump electrode can be eliminated by dividing the bump electrode into two.

Next, the method of manufacturing the semiconductor chip A will be explained in reference to FIG. 11(a) through FIG. 11(c) and FIG. 12(a) and FIG. 12(b).

Figure 11A:
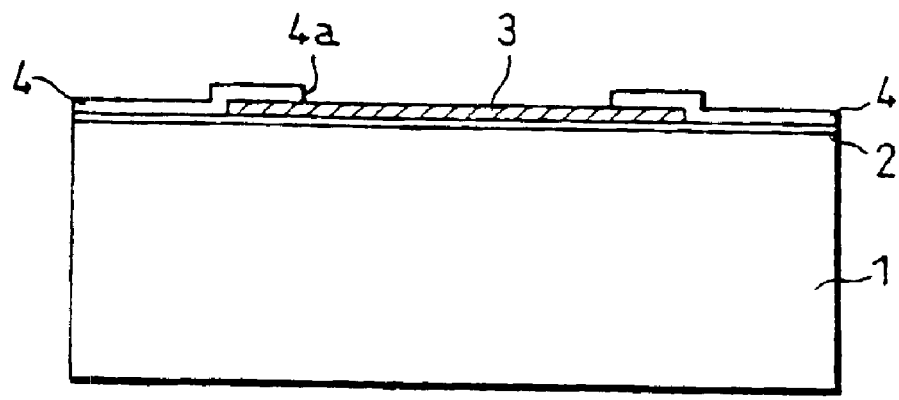
FIG. 11(a), FIG. 11(b) and FIG. 11(c) are cross-sectional views showing a process of manufacturing a semiconductor chip.

As shown in FIG. 11(a), first, on the semiconductor substrate 1, the insulating film 2 made of $SiO_2$, etc., is formed, for example, by the CVD. Then, after forming the electrode pad 3 made of Al, or Al—Si, etc., into a thickness of from 0.5 to 1.1 μm, the protective film 4 made of $SiO_2$, SiN or PSG (phosphorus silicate glass) is formed into a thickness in a range of from 0.5 to 1.0 μm. Thereafter, the protective film 4 is subjected to the patterning to form the opening section 4a.

Figure 11B:
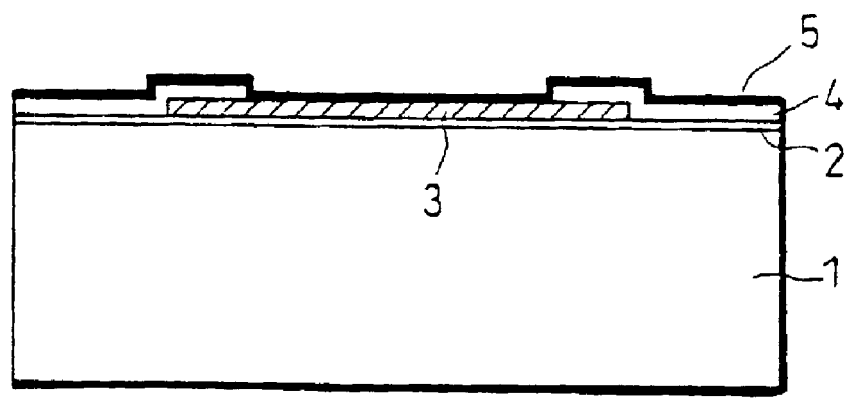

Next, as shown in FIG. 11(b), the barrier metal 5 made of Ti/W, Ti, Cr or Ni, etc., is formed so as to have a thickness in a range of from 0.1 to 0.5 μm by carrying out sputtering or evaporation.

Figure 11C:
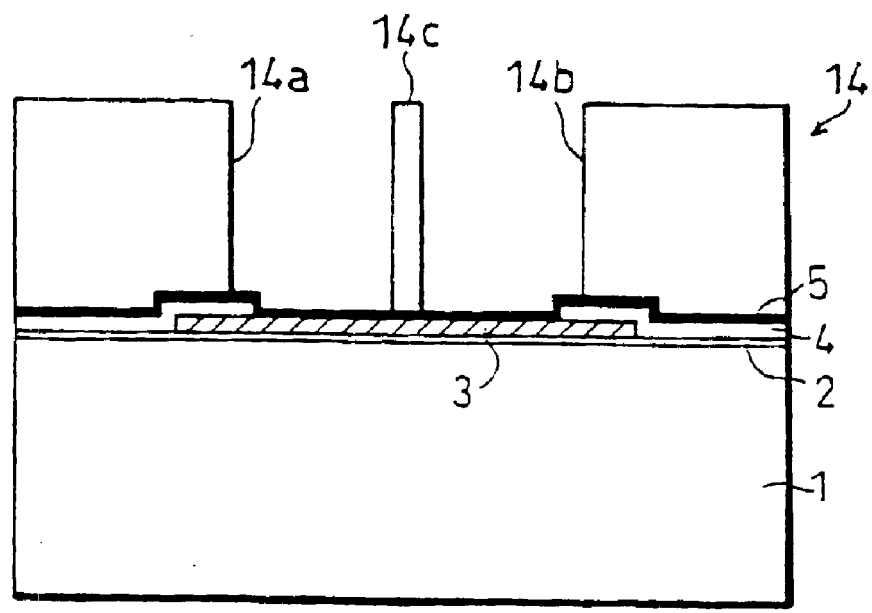

Thereafter, as shown in FIG. 11(c), a photoresist 14 is applied to have a thickness in a range of from 5 to 30 μm onto the barrier metal 5 to be thicker than the bump electrodes 6a and 6b by from a few μm to 5 μm, to leave the portion where the bump electrodes 6a and 6b are to be formed open by the exposure and development. Namely, in the photoresist 14, two openings 14a and 14b are formed. Here, a dividing member 14c is provided for dividing the bump electrodes 6a and 6b, and is subjected to patterning at an interval between the bump electrodes 6a and 6b in a range of from a few μm to 10 μm. The described dividing member 14c may be patterned at a shorter interval if the bump electrodes 6a and 6b can be divided.

Figure 12A:
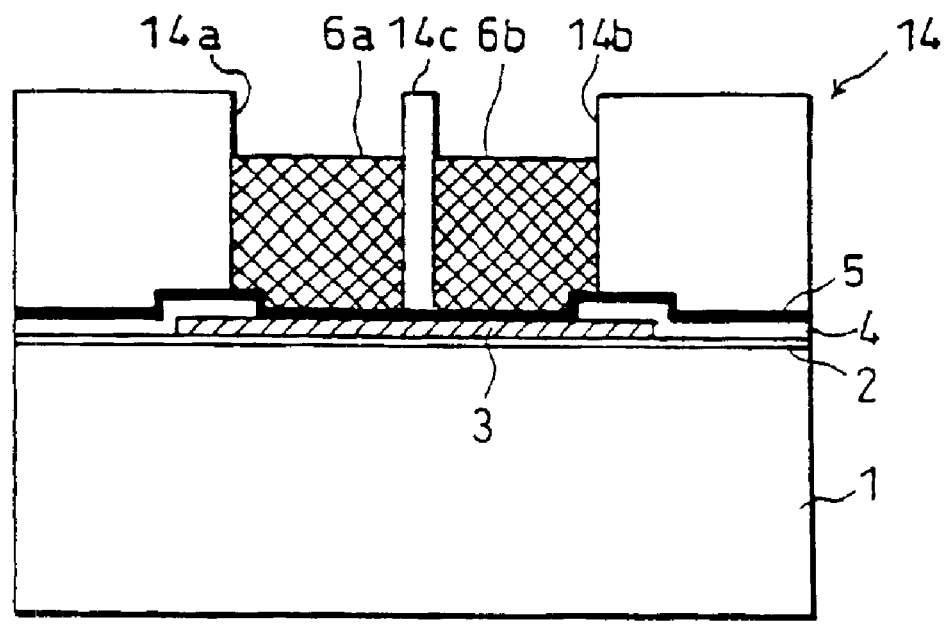
FIG. 12(a) and FIG. 12(b) are cross-sectional views showing the process following the manufacturing process shown in FIG. 11(a) through FIG. 11(c)

As shown in FIG. 12(a), the openings 14a and 14b are Au-plated to form the bump electrodes 6a and 6b. For the Au plating, it is preferable that the side wall forms a perpendicular straight wall by reducing the film thickness to be thinner than the film thickness of the photoresist 14.

Figure 12B:
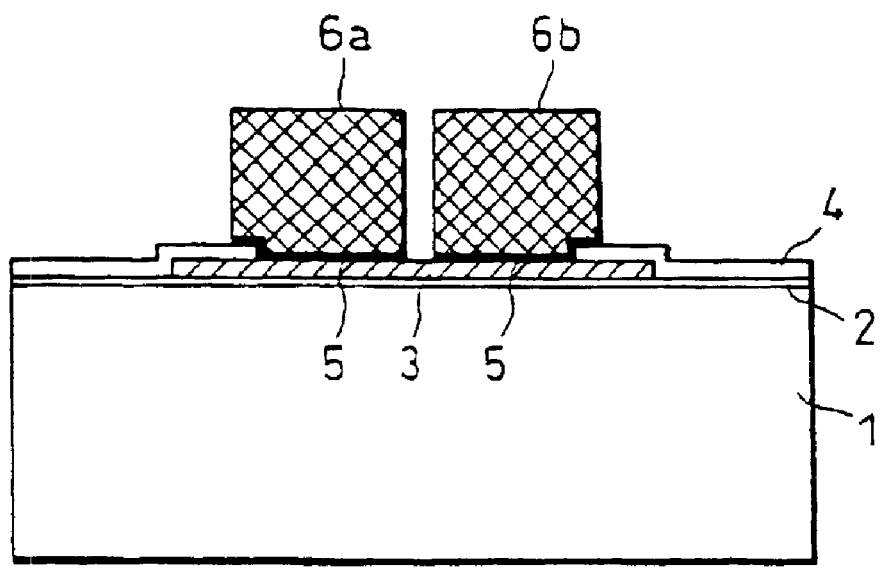
Figure 13A:
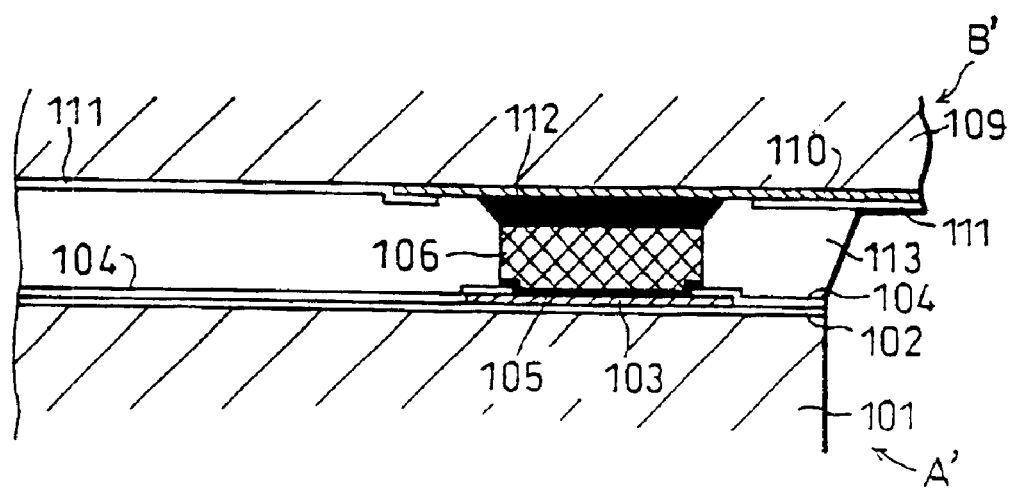
FIG. 13(a) is a cross-sectional view showing a part of a liquid crystal display device where a conventional semiconductor chip is mounted by a paste COG method.
Figure 13B:
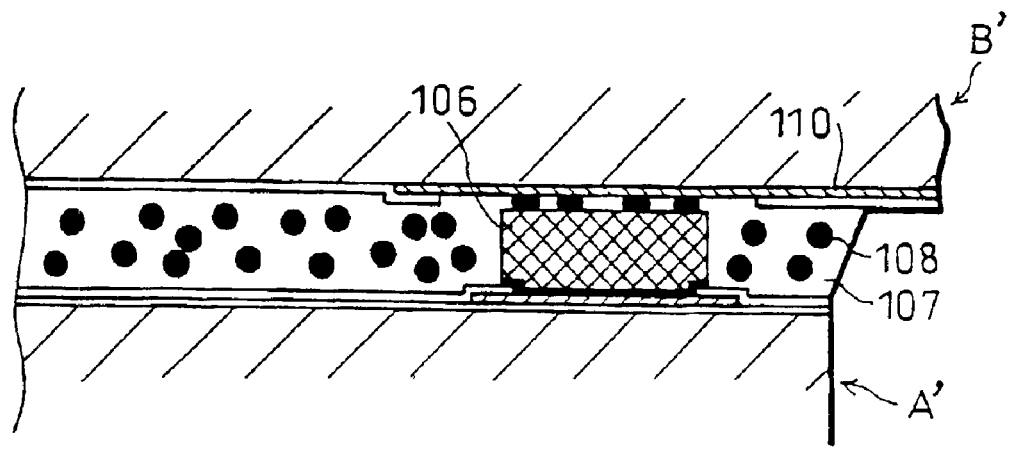
FIG. 13(b) is a cross-sectional view showing the case where the conventional semiconductor chip is mounted by an ACF-COG method.

As shown in FIG. 12(b), after removing the photoresist 14, by removing the unnecessary portion of the barrier metal 5 by etching, the barrier metal 5 remains only in the portion contacting the bump electrodes 6a and 6b.

By dicing the wafer thus formed, an electrical characteristic test can be performed in a stage of wafer before forming the described semiconductor chip A. For example, as shown in FIG. 2(a), according to the described test method, an electrical characteristic can be tested by making a test probe needle in contact with the bump electrode 6a formed on the inner most side of the semiconductor substrate 1 (furthest position from the edge of the chip).

When carrying out the electrical characteristic test, in order to ensure a contact between the bump electrodes 6a and 6b and the test prober, a pressure is applied after the test prober is made in contact with the bump electrode. Therefore, the test prober tends to move inside of the chip. Here, in an arrangement where the test prober is made in contact with the outer bump electrode 6b, if the bump electrode is missing, the prober would push the base portion of the inner bump electrode, which may cause a missing of the inner bump electrode 6a as well. Furthermore, when the test prober is made in contact with the outer bump electrode 6b, in an event of a deformation of the bump electrode 6b due to some problem, the deformation of the outer bump electrode 6b may cause the inner bump electrode 6a to be deformed.

In order to counteract the described problems, the method of testing the semiconductor device in accordance with the present embodiment is arranged such that the test prober is made in contact with the bump electrode 6a formed on the inner most side. As a result, even in an event of an abnormality in an applied pressure to the probe needle, the resulting deformation of the bump electrode, etc., can be limited only to the bump electrodes 6a formed on the inner side of the semiconductor substrate 1, and the bump electrodes formed on the outer side are not affected by such abnormality in an applied pressure As a result, the abnormality in shape of the bump due to a mechanical stress when testing using the test prober can be suppressed to the minimum.

As described, the method of manufacturing the semiconductor chip A prepared by forming the bump electrodes 6a and 6b on respective electrode pads 3 of the semiconductor substrate 1 of the present embodiment includes the step of patterning the photoresist 14, serving as a bump electrode forming mask, to be thicker than the bump electrodes 6a and 6b; and forming the bump electrodes 6a and 6b in a perpendicular straight wall shape to be thinner than the photoresist 14 by plating the electrode pads 3 with the bump electrode forming use metal.

According to the described manufacturing method, when forming the two bump electrodes 6a and 6b for one electrode pad 3 by forming the bump electrodes 6a and 6b into a perpendicular straight wall shape, mutual effects of the plurality of bump electrodes (two in this case) when plating can be eliminated, thereby achieving a significant improvement in its yield. In contrast, when the photoresist is formed thinner than the bump electrodes, the bump electrodes are formed in a mushroom shape. In this case, a plurality of bump electrodes cannot be prepared at high yield, and similar problems to those associated with the conventional arrangement would arise.

Moreover, the semiconductor chip A of the present embodiment is arranged such that a plurality of electrode pads 3 are formed in parallel onto the semiconductor substrate 1, on each of the electrode pads 3, the bump electrodes 6a and 6b are aligned in a straight line in a direction orthogonal to the direction where the electrode pads 3 are aligned.

Figure 2B:
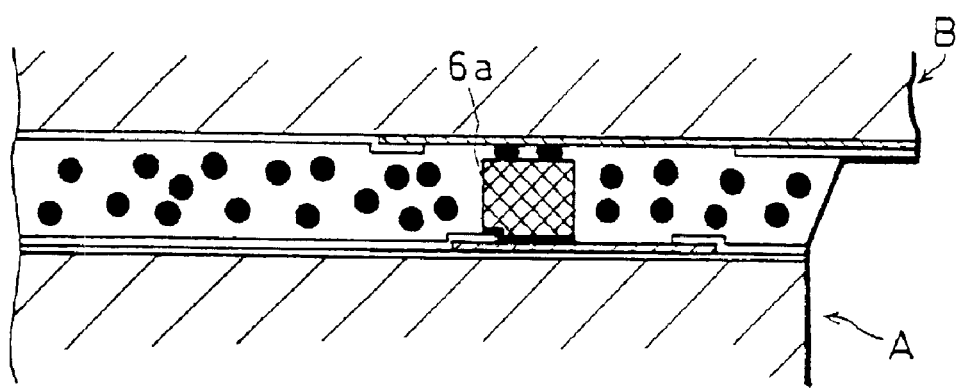
FIG. 2(b) is a cross-sectional view showing a case where one of two divided bump electrodes is missing.
Figure 2C:
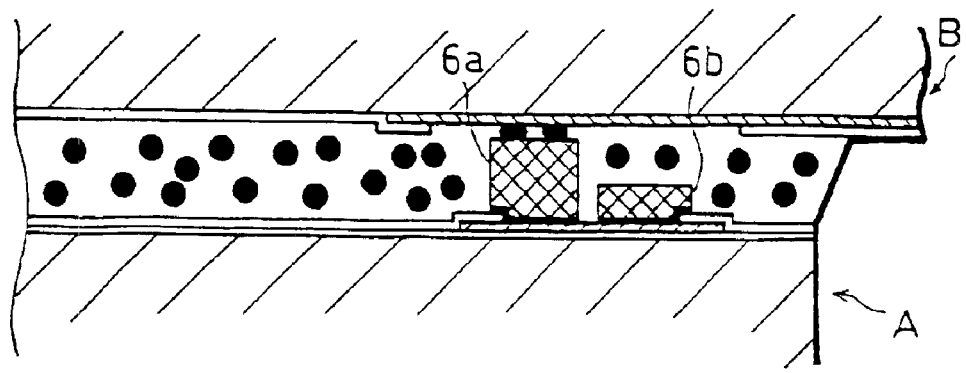
FIG. 2(c) is a cross-sectional view showing a case where one of two divided bump electrodes is lower than the other.

According to the described arrangement, as shown in FIG. 2(b) and FIG. 2(c), for example, even in the case where the bump electrode 6b is missing, or the bump height of the bump electrode 6b is significantly lower than the bump electrode 6a, a contact state between the semiconductor chip A and the liquid crystal panel B can be maintained. This can be said for the case where some inconvenience occurs in the bump electrode 6a, and in such case, a contact state with the liquid crystal panel B can be maintained by means of the bump electrode 6b.

As described, according to the present embodiment, even if a connection inferior occurs due to a missing of one of the divided bump electrodes, or a gap in bump height, a normal contact state can be ensured using the other bump electrode. As a result, assumed that respective proportions of a defect of the divided bump electrodes 6a and 6b are 1.02% of that of the case where the non-divided bump electrodes are adopted, of all outputs of 240 chips, the proportion of defective divided bump electrodes on the electrode pad is given as 1.02×1.02×1/240 =0.4 ppm. Compared with the case where of adopting the non-divided bump electrodes, a defective rate when mounting can be significantly reduced.

Furthermore, as the bump electrodes 6a and 6b are aligned in a direction orthogonal to the direction where the electrode pads 3 are aligned, an interval between the electrode pads 3 can be reduced to the minimum. As this enables a narrower electrode pad pitch, the semiconductor chip A can be reduced in size.

The electrode pad 3 is arranged such that the width "a" in the direction where the electrode pads 3 are aligned is shorter than the width "b" in the direction orthogonal to the direction where the electrode pads 3 are aligned. As this arrangement permits a narrower electrode pad pitch, a chip of an integrated circuit in which a plurality of electrode pads 3 are placed in parallel can be reduced in size. As a result, a semiconductor chip A for the integrated circuit, etc., having a greater number of terminals can be achieved.

Further, the feature that the bump electrodes 6a and 6b have connection surfaces in the same shape permits thickness deviations of the plate when plating to be reduced.

Moreover, as the two bump electrodes 6a and 6b are provided, the width "b" in a direction orthogonal to the direction where the electrode pads 3 are aligned can be reduced to the minimum. As a result, an area occupied by the wiring section can be reduced to the minimum, thereby permitting the semiconductor chip A to be still reduced in size.

In the case of adopting the two bump electrodes 6a and 6b, each electrode pad 3 is arranged so as to have a ratio of the width in the direction where the electrode pads 3 are aligned to the width in a direction orthogonal to the direction where the electrode pads 3 are aligned of approximately 1 to 2. As this permits the electrode pad area to be reduced, the semiconductor chip can be reduced in size.

Additionally, as at least one of the bump electrodes 6a and 6b has a sufficient connection surface for a test prober, a desirable contact of a probe needle can be achieved. As this permits the electrical characteristic test of the device to be performed in the wafer stage, a significant reduction in assembling cost can be achieved.

Figure 3A:
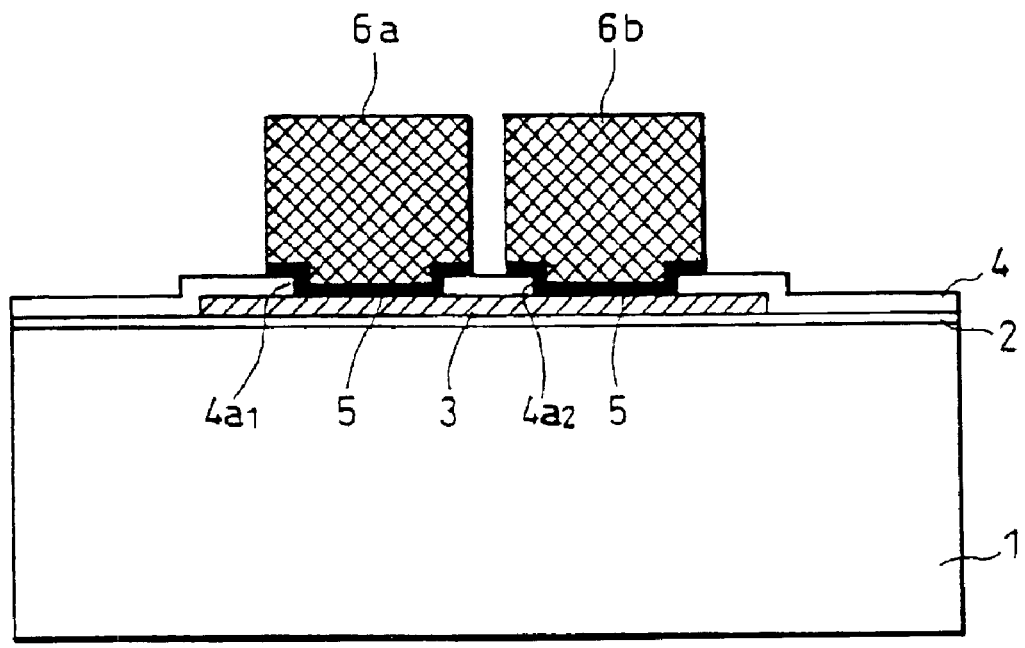
FIG. 3(a) and FIG. 3(b) are cross-sectional views respectively showing structures of a protective film of the semiconductor chip.
Figure 3B:
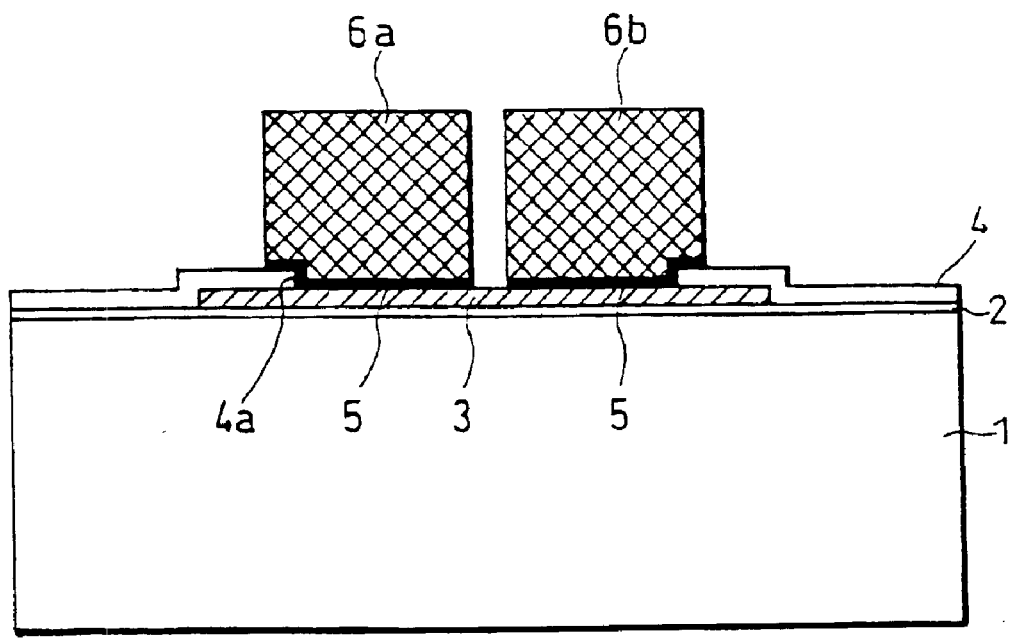

In the present embodiment, when forming the divided bump electrodes 6a and 6b onto the electrode pad 3, as shown in FIG. 3(b), by forming one opening section 4a in the protective film 4, the electrode pad 3 is exposed at the divided part of the bump electrodes 6a and 6b. However, the arrangement shown in FIG. 3(a) may be equally adopted. Namely, it may be arranged so as to form the protective film 4 also in the divided portion of the bump electrodes 6a and 6b so that the electrode pad 3 is not exposed in the divided portion by forming the opening sections $4a_1$ and $4a_2$ in the same number (two in this example) as the number of the bump electrodes 6a and 6b.

Moreover, as the exposed portion of the electrode pad 3 is eliminated, the electrode pads 3 can be prevented from being melted when etching the barrier metal 5 in the process of preparing the bump electrodes. Furthermore, the electrode pad 3 can be prevented from corroding after being mounted. As a result, an improved reliability of a connected state can be achieved.

In the present embodiment, the electrode pads 3 of a single layer structure are adopted. However, an electrode pad section of a multi-layered metal stricture composed of a lower layer electrode pad 3a, an interlayer insulating film 3b and an upper layer electrode pad 3c (see FIG. 4(a)) may be adopted. Here, it is preferable that the size of the opening section of the interlayer insulating film 3b be larger than the outer size of the bump electrode 6. It is further preferable that the opening section of the interlayer insulating film be larger than the outer size of the bump electrode 6 by a total thickness T of the upper electrode pad 3c and the protective film 4. For example, the thickness T is around 2 μm.

Figure 4A:
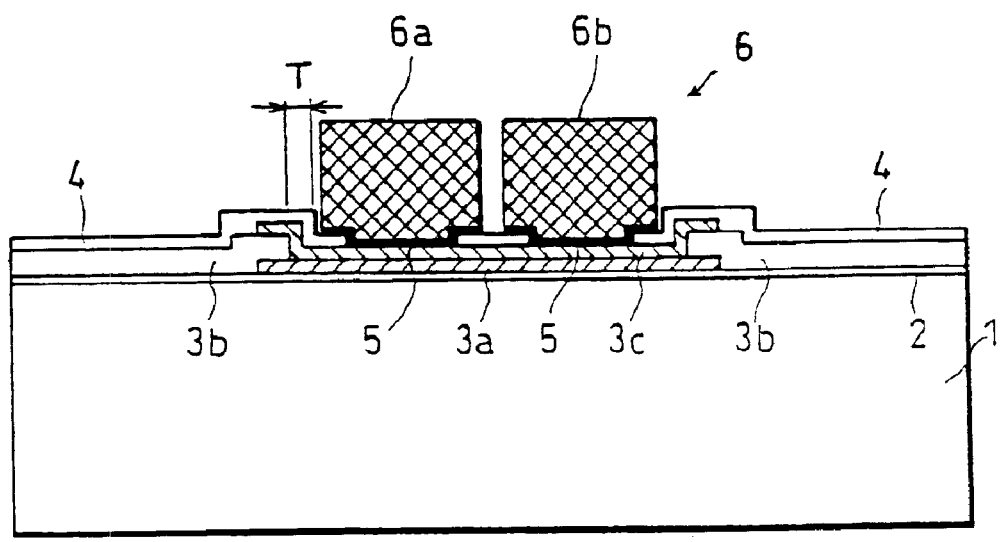
FIG. 4(a) is a cross-sectional view showing a structure of an interlayer insulating film in the case of adopting a semiconductor chip of a double-layered metal structure.
Figure 4B:
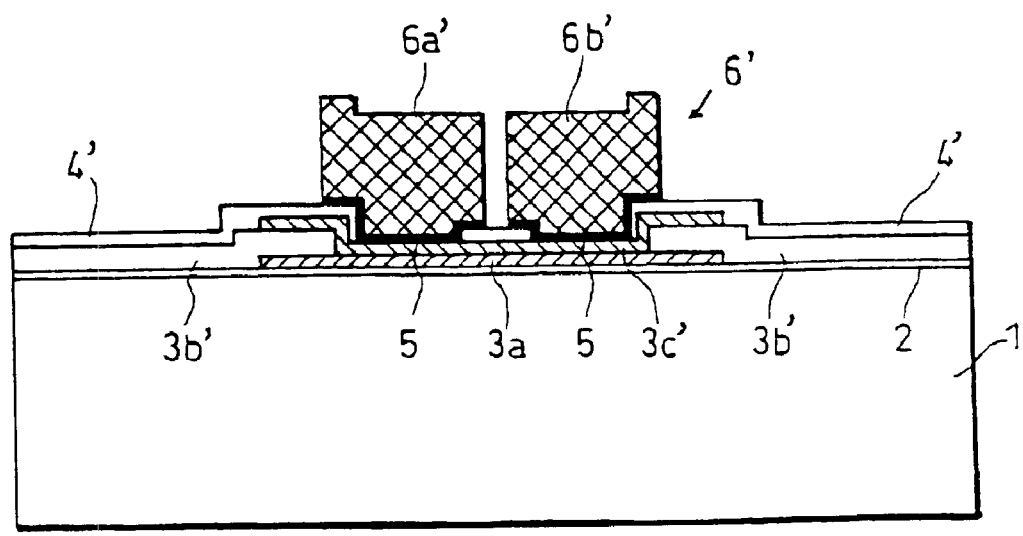
FIG. 4(b) is a cross-sectional view showing a case where the interlayer insulating film creates a gap in height of the bump electrodes.

According to the described arrangement, a level difference in the opening wall of the interlayer insulating film 3b does not affect the bump electrodes 6a and 6b, and the bump electrodes 6a and 6b having flat connection surfaces can be formed, thereby improving a reliability of the connected state. In contrast, as shown in FIG. 4(b), when the size of the opening section of the interlayer insulating film 3b' is smaller than the circumference of the bump electrode 6', a gap due to the opening wall appears on the connection surfaces of the bump electrodes 6a' and 6b'. The respective thicknesses of the upper layer electrode pad 3c' and the protective film 4' also affect the shape of the connection surface of the bump electrode 6a' and 6b'.

In the present embodiment, explanations will be given through the case of mounting the semiconductor chip A by the ACF-COG method. However, the semiconductor chip A may be mounted by the paste COG method. However, in view of simplifications of the manufacturing process and a reduction in cost, it is preferable to adopt the ACF-COG method.

Figure 5A:
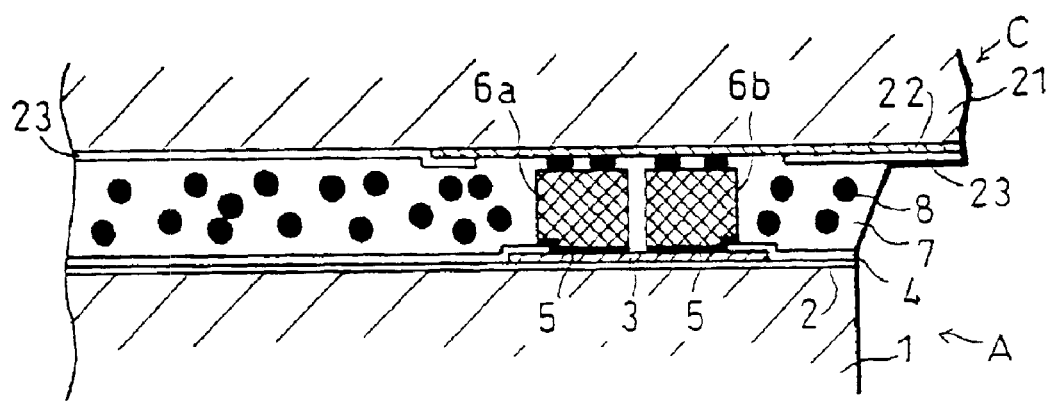
FIG. 5(a) is a cross-sectional view showing a part of a circuit substrate where the semiconductor chip is face-down-bonded by means of an ACF.
Figure 5B:
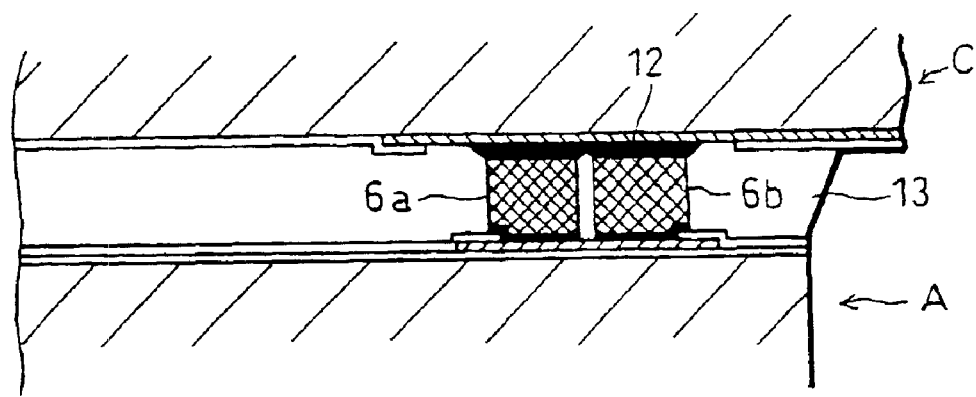
FIG. 5(b) is a cross-sectional view showing a part of a circuit substrate where the semiconductor chip is face-down-bonded by means of a paste.
Figure 6:
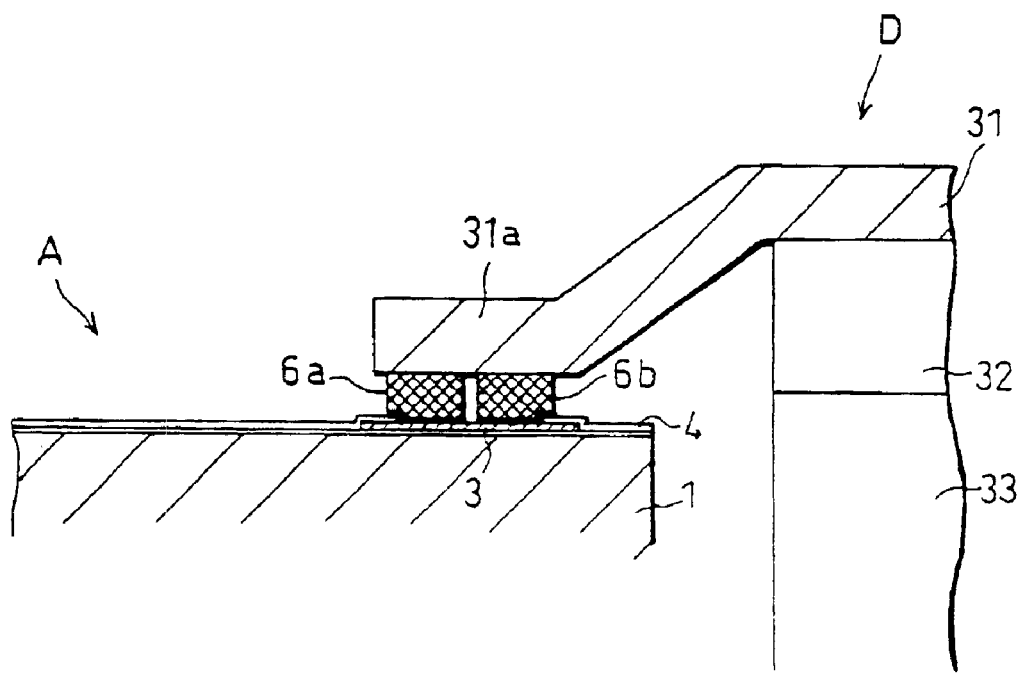
FIG. 6 is a cross-sectional view showing a TCP where the semiconductor chip is mounted.

As shown in FIG. 5(a) or FIG. 5(b), the present invention is applicable to not only the liquid crystal display device, but also to a circuit substrate wherein the semiconductor chip A is mounted to the substrate C such as a print substrate, a ceramic substrate, etc., by means of the ACF (binder resin 7 and conductive particles 8) or by means of the paste 12. The substrate C includes a substrate 21 whereon an electrically conductive pattern 22 and a protective film 23 are formed, and the electrode pad 3 of the semiconductor chip A is face-down bonded to the input and output terminals of the electrically conductive pattern 22 via the bump electrodes 6a and 6b. Furthermore, as shown in FIG. 6, the present invention is also applicable to a TCP wherein the semiconductor chip A is mounted to a tape carrier D. The tape carrier D is prepared by bonding the conducive pattern 31 onto the insulating film 33 having a device hole by means of a bonding agent 32, and a conductive lead 31a which is integrally formed with the conductive pattern 31 extends and is projected through the device hall. For both cases of the circuit substrate and the TCP, the same effects as achieved from the liquid crystal display device can be achieved.

Figure 7A:
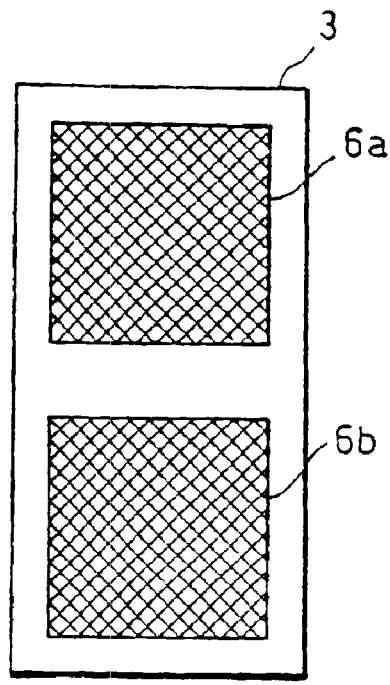
FIG. 7(a) is a plan view showing a shape of connection surfaces of bump electrodes.
Figure 7B:
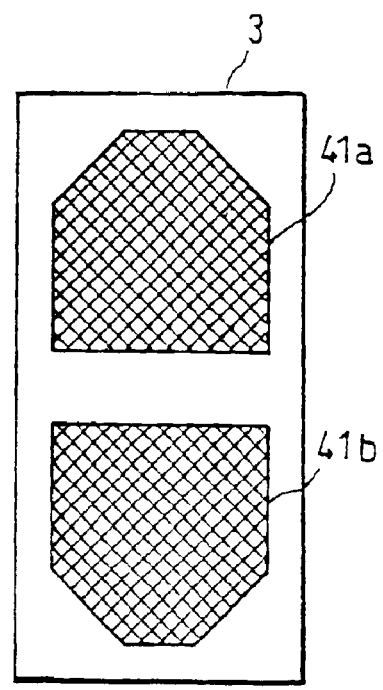
FIG. 7(b) is a plan view showing another shape of the connection surfaces of the bump electrodes.
Figure 7C:
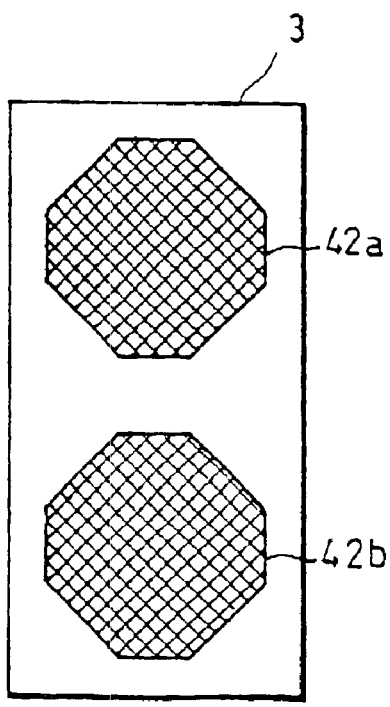
FIG. 7(c) is a plan view showing still another shape of the connection surfaces of the bump electrodes.
Figure 7D:
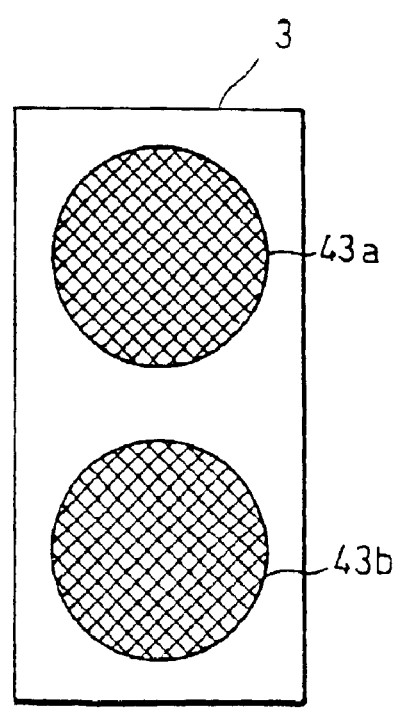
FIG. 7(d) is a plan view showing yet still another shape of the connection surfaces of the bump electrodes.

In the present embodiment, the connection surfaces of the bump electrodes 6a and 6b are formed into square shape as shown in FIG. 7(a), but may be formed into rectangular shape. Moreover, (i) the bump electrodes 41a and 41b (see FIG. 7(b)) wherein two bump corners of the bump electrode are cut for each bump electrode to be symmetrical with respect to the divided portions of the bump electrodes; (ii) bump electrodes 42a and 42b (see FIG. 7(c)) wherein the four bump corners of each bump electrode are cut to form connection surfaces in an octagon shape; and the bump electrodes 43a and 43b (see FIG. 7(d)) wherein the respective connection surfaces of the bump electrodes are circular or elliptical in shape may be adopted.

The divided two electrode pads may be formed into substantially the same shape. However, the two bump electrodes formed on the electrode pads may be also arranged such that one of the bump electrodes has a connection surface in different shape from that of the other bump electrode. To be specific, the bump electrode composed of a bump electrode 44a having a connection surface of a square shape and a bump electrode 44b having a connection surface of a circular shape may be adopted at the same time (see FIG. 8).

In the present embodiment, the rectangular electrode pad is adopted; however, in the case of adopting the bump electrodes 45a and 45b whose bump corners are cut to be curved, an electrode pad 45 (see FIG. 9(a)) whose corners are cut into a shape in conformity with the shape of the bump electrodes 45a and 45b may be adopted, or an electrode pad 47 (see FIG. 9(c)) having a curved short side may be adopted. Additionally, in the case of adopting the bump electrodes 46a and 46b having circular connection surfaces, if a sufficient electrode pad pitch can be ensured, the electrode pad 46 (see FIG. 9(b)) which is elliptical in shape may be adopted.

The connection surface of the bump electrode or the electrode pad may be formed into a shape as desired to be best suited for the conductive pattern or the conductive lead of the base member to which the semiconductor chip is mounted. As a result, a desirable connected state can be achieved with an improved reliability. Additionally, by forming the shape of the connection surface to be suited for the base member, an amount of the material for use in the bump electrode can be reduced. Here, as a valuable Au is used for the bump electrode material, it is effective to reduce an amount of the material for use in the bump electrodes to reduce the cost.

Figure 10:
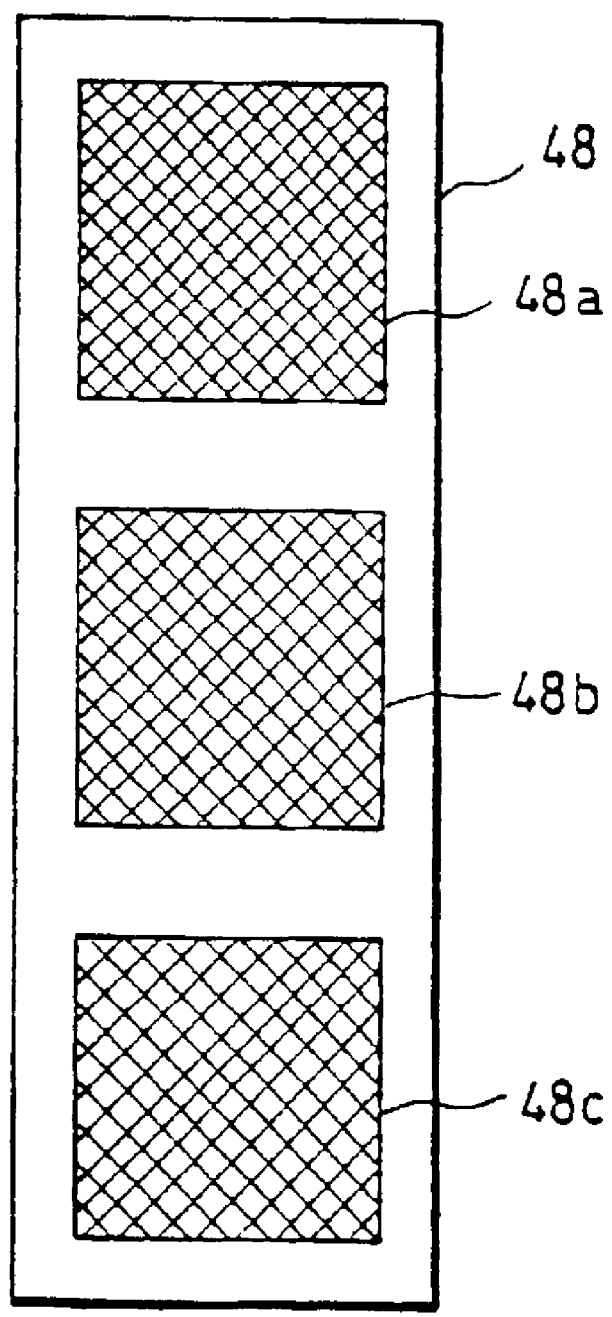
FIG. 10 is a plan view showing a case of adopting three divided bump electrodes.

In the present embodiment, the two bump electrodes are formed on one electrode pad; however, more electrode pads may be formed (see FIG. 10). In the case of placing three bump electrodes 48a, 48b and 48c, however, a larger area is required for the electrode pad 48. Therefore, in order to minimize the area occupied by the electrode pads in the semiconductor chip, it is desirable to provide two bump electrodes. Moreover, as described earlier, two divided bump electrodes would be sufficient for the purpose of reducing a defective rate.

As discussed earlier under the section "BACKGROUND OF THE INVENTION", four divided bump electrodes are adopted for the purpose of suppressing a generation of a thermal stress. For this purpose, it is considered to be effective to adopt the four divided bump electrodes for dispersing the force against the thermal stress, and for practical applications. However, in the present invention, especially, in its application to the liquid crystal display device, as a current flowing in one chip is small, it is not necessary to take the thermal stress into consideration. On the other hand, the miniaturization is essential for the liquid crystal display device. To meet this, as the wiring pitch is needed to be reduced, it is preferable to divide the bump electrode into two.

As described, the semiconductor device of the present invention wherein a plurality of electrode pads are aligned on the semiconductor substrate, and a plurality of bump electrodes are formed on each of the plurality of electrode pads is characterized in that the plurality of bump electrodes on the respective electrode pad are aligned in a direction orthogonal to the direction where the electrode pads are aligned. Namely, the plurality of bump electrodes are aligned in a straight line on the electrode pad.

According to the described arrangement, since the bump electrode is divided into a plurality of divided bump electrodes with respect to one electrode pad, a ratio of an inferior bump electrode can be reduced compared with the case of adopting a single bump electrode. Namely, in the case of adopting a single bump electrode, if a missing of a bump electrode occurs or a significant gap is generated between heights of adjoining bump electrodes, etc., a connection inferior occurs when mounting the semiconductor device. However, in the case of adopting a plurality of bump electrodes, even if a missing of a bump electrode occurs or a gap in height exists in some of the plurality of bump electrodes, as long as at least a connected state with one bump electrode is maintained, an occurrence of a connection inferior can be prevented. As this permits a ratio of a connection inferior when mounting the semiconductor device to be significantly reduced, an improved yield when forming the bump electrodes and an improved reliability of the connected state can be achieved.

Furthermore, as a plurality of bump electrodes are aligned in a direction orthogonal to the direction where the electrode pads are aligned, an interval between the electrode pads is reduced to the minimum. As this permits a narrower electrode pad pitch, the semiconductor device can be reduced in size.

According to the described arrangement, it is desirable that the electrode pads are arranged such that the width "a" in a direction where the electrode pads are aligned is shorter than the width "b" in a direction orthogonal to the direction where the electrode pads are aligned.

As a result, the electrode pads can be formed on the semiconductor substrate at a still narrower pitch, and the chip size of the integrated circuit in which a plurality of electrode pads are aligned can be reduced. As a result, a semiconductor device such as an integrated circuit having many terminals can be achieved.

Moreover, it is further preferable that each of the described arrangement be arranged such that the plurality of bump electrodes on the electrode pads have connection surfaces of the same shape.

As a result, thickness deviations of a plate when plating can be reduced to the minimum.

In each of the described arrangement, it is preferable that the number of the plurality of bump electrodes on the respective electrode pad is two.

According to the described arrangement, the width "b" in a direction orthogonal to the direction where the electrode pads are aligned can be reduced to the minimum. As a result, an area occupied by the wiring section can be reduced to the minimum, and thus the semiconductor device can be reduced in size.

In the described arrangement, it is preferable that each electrode pad be arranged such that the width in a direction where the electrode pads are aligned to the width in a direction orthogonal to the direction where the electrode pads are aligned is approximately 1 to 2.

By adopting two divided bump electrodes on each electrode pad, a required area for the electrode pads can be reduced to the minimum, and the chip size can be minimized.

In each of the described arrangements, it is preferable that at least one of the plurality of bump electrodes on one electrode pad has a sufficient connection surface area which allows a test prober to contact thereon.

As a result, the device can be tested in a stage of wafer, and an assembling cost can be significantly reduced.

In each of the described arrangements, it is preferable that the protective film having opening sections be formed between each electrode pad and the plurality of bump electrodes, and that the opening sections be formed in the same number as the number of the bump electrodes.

According to the described arrangement, as the opening section of the protective film is divided corresponding to the divided bump electrodes, the exposed portion of the electrode pad is eliminated, and thus the melting of the electrode pad when preparing electrode bumps or a corrosion of the electrode pad after mounting can be prevented, thereby achieving a desirable connected state with an improved reliability.

In each of the described arrangements, it is preferable to adopt a multi-layered metal structure for the electrode pad in which an interlayer insulating film is formed, and the opening section of the interlayer insulating film be formed larger than the outer size of the plurality of the bump electrodes.

According to the described arrangement, a bump electrode having a flat connection surface can be formed without having such a problem that a gap generated by the opening section of the interlayer insulating film affects the connection surface of the bump electrode, thereby achieving an improved reliability of the connected state. The liquid crystal display device of the preset invention is arranged such that the semiconductor device is face-down-bonded to the input and output terminals of the conductive pattern formed on the liquid crystal panel.

The circuit substrate of the present invention is arranged such that the semiconductor device of the present invention is face-down-bonded to the conductive pattern formed on the substrate such as a print substrate or a ceramic substrate.

The tape carrier package of the present invention is arranged such that the semiconductor device is connected to the conductive lead extending to the device hole which is integrally formed with the conductive pattern formed on the insulating film having the device hole. As a result, as the semiconductor device is mounted, the liquid crystal display device, the circuit substrate or TCP of a reduced size can be achieved with an improved reliability of the connected state.

The manufacturing method of the semiconductor device of the present invention includes the step of patterning a photoresist serving as a bump electrode forming mask on a semiconductor substrate having formed thereon the electrode pads, to be thicker than the bump electrodes, and a step of forming bump electrodes in a perpendicular straight wall shape, to be thinner than the photoresist by plating the electrode pads with the bump electrode forming use metal.

According to the described arrangement, mutual effects among a plurality of bump electrodes when plating can be eliminated, thereby achieving an improved yield when preparing bump electrodes.

The testing method of the semiconductor device of the present invention includes a step of testing an electrical characteristic by making the test prober in contact with the bump electrode formed on the inner most side of the semiconductor substrate.

As a result, even if an abnormality occurs in an applied pressure of the test prober, a deformation of the bump electrode by the mechanical stress when testing using the test prober can be minimized.

Without further analysis, the foregoing will so fully reveal the gist of the present invention that others can, by applying current knowledge, readily adapt it for various applications without omitting features that, from the standpoint of prior art, fairly constitute essential characteristics of the generic and specific aspects of the instant contribution to the art and, therefore, such adaptations should and are intended to be comprehended within the meaning and range of equivalence of the appended claims.

What is claimed is:

1. A semiconductor device including a plurality of bump electrodes, respective surfaces of the bump electrodes being adapted for electrical connection to a first electrode elongated in length so as to extend in a direction crossing an edge of a semiconductor substrate so that the first electrode crosses the edge of the semiconductor substrate, the semiconductor device comprising:

said semiconductor substrate;

a plurality of electrode pads aligned in parallel in a first direction on said semiconductor substrate along the edge of said substrate;

spaced apart bump electrodes being placed on each of said plurality of electrode pads so that a plurality of the spaced apart bump electrodes are placed on each of the electrode pads, said plurality of bump electrodes on each respective electrode pad being spaced apart from one another and aligned in a second direction orthogonal to said first direction, wherein no bump electrode on any given electrode pad is spaced apart from another bump electrode on said given electrode pad in said first direction;

wherein in a state where respective upper surfaces of a pair of the bump electrodes on one of said electrode pads are electrically connected to the first electrode that is lengthwise extending in the direction crossing the edge of the semiconductor substrate, the first electrode crosses a spacing between said pair of bump electrodes;

wherein each of the plurality of electrode pads is formed in the same shape and extends straight in the second direction; and wherein a space in the second direction between the bump electrodes formed on each of the plurality of electrode pads is smaller than a size in the second direction of each of the bump electrodes.

2. The device of claim 1, further comprising:

a protective film having a plurality of opening sections, formed between the one electrode pad and the pair of bump electrodes thereon, wherein the plurality of opening sections are formed in the same number as a number of the plurality of bump electrodes.

3. The semiconductor device of claim 1, wherein all electrode pads aligned in parallel along said edge of said substrate have a plurality of bump electrodes thereon aligned in said second direction and wherein said first direction is parallel to said edge of said substrate.

4. The semiconductor device of claim 1, wherein said respective upper surfaces of the pair of the bump electrodes on said one of the electrode pads are electrically connected to a planar portion of said first electrode so that no portion of said first electrode is located directly between the pair of bump electrodes.

5. The semiconductor device of claim 1, wherein said respective upper surfaces of the pair of the bump electrodes on said one of the electrode pads are electrically connected to said first electrode so that no portion of said first electrode is located directly between the pair of bump electrodes.

6. The device of claim 1, wherein each of said plurality of electrode pads is structured such that a width in a direction where the electrode pads are aligned is shorter than a width in a direction orthogonal to the direction where the electrode pads are aligned.

7. The device of claim 1, wherein said plurality of bump electrodes on one of the electrode pads respectively have connection surfaces of a same shape.

8. The device of claim 1, wherein a number of said plurality of bump electrodes on one of said electrode pads is two.

9. The device of claim 8, wherein a ratio of a width in a direction where the plurality of pads are aligned to a width in a direction orthogonal to the direction where said pads are aligned is substantially 1 to 2.

10. The device of claim 1, wherein at least one of said bump electrodes on the electrode pad has a sufficient connection surface area which allows a test probe to contact thereon.

11. The device of claim 11, wherein a protective film which prevents the electrode pad from being exposed is provided between said plurality of bump electrodes on the electrode pad.

12. The device of claim 1, wherein each of the plurality of electrode pads aligned along the edge of the substrate is spaced approximately the same distance from the edge of the substrate.

13. The device of claim 1, wherein each of the plurality of electrode pads aligned along the edge of the substrate is rectangular in shape and symmetrically arranged along the edge of the substrate.

14. The device of claim 1, wherein none of the electrode pads directly contacts another electrode pad.

15. The device of claim 1, wherein a space between the electrode pads in the first direction is smaller than the size in the first direction of each of the plurality of bump electrodes.

16. A tape carrier package, comprising:
an insulating film having a device hole; and
a semiconductor device connected to a conductive lead extending to said device hole which is integrally formed with a semiconductor pattern formed on said insulating film,
wherein said semiconductor device includes:
a semiconductor substrate;
a plurality of electrode pads aligned in a first direction on said semiconductor substrate along an elongated edge of said substrate;
a plurality of bump electrodes aligned on each of said plurality of electrode pads, said plurality of bump electrodes on each respective electrode pad being spaced apart from one another and aligned in a second direction orthogonal to said first direction,
wherein no bump electrode on any given electrode pad is spaced apart from another bump electrode on said given electrode pad in said first direction;
wherein respective upper surfaces of a pair of the bump electrodes on one of said electrode pads are electrically connected to said conductive lead so that said conductive lead crosses a spacing between said pair of the bump electrodes;
wherein each of the plurality of electrode pads is formed in the same shape and extends straight in the second direction; and
wherein a space in the second direction between the bump electrodes formed on each of the plurality of electrode pads is smaller than a size in the second direction of each of the bump electrodes.

17. The package of claim 16, wherein at least first and second electrode pads located adjacent to one another along said edge of said substrate each have said plurality of bump electrodes thereon.

18. The tape carrier package of claim 16, wherein The said respective upper surfaces of the pair of the bump electrodes on said one of the electrode pads are electrically connected to a planar portion of said conductive lead so that no portion of said conductive lead is located directly between the pair of bump electrodes.

19. The tape carrier package of claim 16, wherein said respective upper surfaces of the pair of the bump electrodes on said one of the electrode pads are electrically connected to said conductive lead so that no portion of said conductive lead is located directly between the pair of bump electrodes.

20. The device of claim 16, wherein each of the plurality of electrode pads aligned along the edge of the substrate is spaced approximately the same distance from the edge of the substrate.

21. The device of claim 16, wherein each of the plurality of electrode pads aligned along the edge of the substrate is rectangular in shape and symmetrically arranged along the edge of the substrate.

22. The device of claim 16, wherein the plurality of electrode pads are linear-shaped, and wherein none of the electrode pads directly contacts another electrode pad.

23. The device of claim 16, wherein a space between the electrode pads in the first direction is smaller than the size in the first direction of each of the plurality of bump electrodes.

24. A semiconductor device, comprising:
a semiconductor substrate;
a plurality of electrode pads aligned in parallel in a first direction on said semiconductor substrate along an edge of said substrate;
a plurality of spaced apart bump electrodes placed on each of said plurality of electrode pads, said plurality of bump electrodes on each respective electrode pad being spaced apart from one another and aligned in a second direction orthogonal to said first direction,
wherein no bump electrode on any given electrode pad is spaced apart from another bump electrode on said given electrode pad in said first direction,
wherein respective upper planar surfaces of a pair of the bump electrodes on one of the electrode pads are electrically connected to a planar portion of a first electrode, and said first electrode is larger in size than said pair of the bump electrodes;
wherein each of the plurality of electrode pads is formed in the same shape and extends straight in the second direction; and
wherein a space in the second direction between the bump electrodes on a given one of the electrode pads is smaller than a size in the second direction of each of the bump electrodes on said given one of the electrode pads.

25. The device of claim 24, wherein each of the plurality of electrode pads aligned along the edge of the substrate is spaced approximately the same distance from the edge of the substrate.

26. The device of claim 24, wherein each of the plurality of electrode pads aligned along the edge of the substrate is rectangular in shape and symmetrically arranged along the edge of the substrate.

27. The device of claim 24, wherein the plurality of electrode pads are linear-shaped, and wherein none of the electrode pads directly contacts another electrode pad.

28. The device of claim 24, wherein a space between the electrode pads in the first direction is smaller than the size in the first direction of each of the plurality of bump electrodes.

* * * * *